United States Patent
Kim

(10) Patent No.: US 7,884,424 B2
(45) Date of Patent: Feb. 8, 2011

(54) STRUCTURE OF MTCMOS CELL

(75) Inventor: Dong-Hun Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 247 days.

(21) Appl. No.: 12/183,190

(22) Filed: Jul. 31, 2008

(65) Prior Publication Data

US 2009/0114994 A1    May 7, 2009

(30) Foreign Application Priority Data

Nov. 5, 2007    (KR) .............. 10-2007-0112209

(51) Int. Cl.
*H01L 29/76* (2006.01)
(52) U.S. Cl. ............ 257/371; 257/758; 257/27.067
(58) Field of Classification Search ........... 257/369, 257/371–373, 376, 758, E27.067
See application file for complete search history.

(56) References Cited

U.S. PATENT DOCUMENTS 6,307,233 B1 * 10/2001 Awaka et al. ............ 257/368
7,521,762 B2 * 4/2009 Hidaka ..................... 257/369
2005/0151579 A1 * 7/2005 Kakiuchi ................. 327/534

FOREIGN PATENT DOCUMENTS

JP    2000-082951    3/2000
KR    1999-0047342    7/1999

* cited by examiner

*Primary Examiner*—Tuan N. Quach
(74) *Attorney, Agent, or Firm*—Sherr & Vaughn, PLLC

(57) ABSTRACT

An architecture of the layout of the MTCMOS standard cell designed for low power consumption is supplemented so that the pick-up cells are included in the power line of the MTCMOS cell. Therefore, when the logic circuit is constructed using the library layout of the MTCMOS cell in which the related pick-up cells are not included, pick-up cells consisting of only the ends of the pick-up cells are not needed every 50 μm during the placement of the MTCMOS standard cell. The flexibility of the cell placement may thereby be improved. In addition, since additional space for the pick-up cells is not required, the size of the MTCMOS may be reduced, saving space on the semiconductor substrate.

4 Claims, 6 Drawing Sheets

STRUCTURE OF MTCMOS CELL

CROSS REFERENCE TO PRIOR APPLICATION

The present application claims priority under 35 U.S.C. 119 to Korean Patent Application No. 10-2007-0112209 (filed on Nov. 5, 2007), which is hereby incorporated by reference in its entirety.

BACKGROUND OF THE INVENTION

In general, a MTCMOS refers to a structure in which MOS switches with relatively high threshold voltages (high-$V_{th}$) are serially connected between a power source and a logic circuit. To reduce power consumption, power may be connected to or disconnected from the logic circuit (including MOS transistors with a relatively low threshold voltage) by turning on or off MOS switches.

FIG. 1A illustrates the structure of a MTCMOS cell 100. FIG. 1B illustrates the structure of a MTCMOS cell 110 in which high-Vth transistors 104 and 106 are inserted into the upper and lower ends of the CMOS cell 102 so that current flow can be stopped in sleep mode. Referring to FIG. 1B, a PMOS transistor 104 inserted into the upper end of the CMOS cell 102 is referred to as a header. An NMOS transistor 106 inserted into the lower end of the CMOS cell 102 is referred to as a footer. A virtual $V_{DD}$ line is connected between the header 104 and the CMOS cell 102 and a virtual ground (GND) is connected between the footer 106 and the CMOS cell 102. Therefore, in sleep mode, due to the high threshold voltage of the footer 104, leakage current can be effectively broken.

FIG. 2 illustrates the layout of the MTCMOS cell 110 of FIG. 1. FIG. 2 illustrates an example of using NMOS transistor 202 as the footer. As illustrated in FIG. 2, in the MTCMOS cell 110, two kinds of transistors 200 and 202 with a low threshold voltage Low-Vth and a high threshold voltage High-Vth are used. To increase speed, transistor 200, with a low threshold voltage, is used, since the MTCMOS cell for switching a signal needs to operate at high speed. To reduce leakage current, footer transistor 202, with a high threshold voltage, is used as a cutoff switch. In this layout of the MTCMOS cell 110, pick-up cells including N+ and P+ implants together with the MTCMOS cell 110 are required.

FIG. 3 illustrates the placement of a MTCMOS cell 304 and pick-up cells 300 and 302 in the layout of MTCMOS. In the layout of the MTCMOS, as illustrated in FIG. 3, the MTCMOS cell 304 without having any pick-up and the pick-up cells 300 and 302 consisting of the pick-up only are adjacent to each other and connected to each other. In order to effectively supply the power source to the cells 304, the pick-up cells 300 and 302 are commonly placed to be separated from the MTCMOS cell 304 by the distance of 50 μm. In FIG. 3, a reference numeral represents a power line in PMOS area of the MTCMOS cell 304.

FIG. 4 is a sectional view taken along a power line 306 in PMOS area of the MTCMOS cell 304 without the pick-up in FIG. 3 in a horizontal direction, in which the pick-up cells 300 and 302 are positioned on both sides of the MTCMOS cell 304. In this regard, as illustrated in FIG. 4, the pick-up cells 300 and 302 have only N+ in the end of the PMOS area. Since the MTCMOS cell 304 does not have N+, the MTCMOS cell 304 must be used together with the pick-up cells 300 and 302. In FIG. 4, a reference numeral 404 refers to a contact and a reference numeral 404 refers to a metal line.

That is, in the layout of the related MTCMOS, it is necessary to separate the MTCMOS cell and the pick-up cells from each other by the distance of 50 μm, which hinders an effective placement of the MTCMOS cell and the pick-up cells. Further, such an MTCMOS architecture needs to use additional pick-up cells so that the space of the semiconductor substrate is unnecessarily wasted.

BRIEF SUMMARY THE INVENTION

Embodiments relate to a method of fabricating a semiconductor device, and more particularly, to the structure of a multi-threshold CMOS (hereinafter, referred to as MTCMOS) cell in which the architecture of the layout of a MTCMOS standard cell designed for low power consumption is supplemented so that pick-up cells may be included in a power line. This can improve flexibility when the size of the MTCMOS cell is reduced, and the MTCMOS cell is placed on a substrate.

Embodiments relate to a method of fabricating a MTCMOS in which the architecture of the layout of a MTCMOS standard cell having a structure for low power consumption is supplemented so that pick-up cells may be included in the power line of the MTCMOS cell. This may improve flexibility when the size of the MTCMOS cell is reduced and the cells are placed on a substrate. Embodiments also relate to preventing inefficient placement of the cells and wasting space that are caused by additionally realizing the MTCMOS cell and the pick-up cells on a semiconductor substrate at uniform intervals in the related MTCMOS layout.

Embodiments relate to a method of fabricating a MTCMOS, including: forming an n-well and a p-well in an active region over a semiconductor substrate; forming a p-type transistor in the n-well region and forming an n-type transistor in the p-well region; forming an n+ pick-up cell and a p+ pick-up cell in regions adjacent to a drain of the p-type transistor and a source of the n-type transistor; and forming a first metal wiring line for connecting the drain of the p-type transistor, the source of the n-type transistor, and the n+ and p+ pick-up cells to each other.

Embodiments relate to a structure of a MTCMOS cell, including an n-well and a p-well, which may be formed in an active region over a semiconductor substrate. A p-type transistor may be formed in the n-well region and an n-type transistor formed in the p-well region. A first metal wiring line may connect a drain of the p-type transistor and a source of the n-type transistor to each other. An n+ pick-up cell may be connected to the first metal wiring line in a region adjacent to a drain of the p-type transistor. A p+ pick-up cell may be connected to the first metal wiring line in a region adjacent to the source of the n-type transistor.

According to embodiments, the architecture of the layout of the MTCMOS standard cell designed for low power consumption is supplemented so that the pick-up cells are included in the power line of the MTCMOS cell. Therefore, when the logic circuit is constructed using the library layout of the MTCMOS cell in which the related pick-up cells are not included, pick-up cells consisting of only the ends of the pick-up cells are not needed every 50 μm during the placement of the MTCMOS standard cell. The flexibility of the cell placement may thereby be improved. In addition, since additional space for the pick-up cells is not required, the size of the MTCMOS may be reduced, saving space on the semiconductor substrate.

BRIEF DESCRIPTION OF THE DRAWINGS

Example

Example

Example

DETAILED DESCRIPTION OF THE INVENTION

In embodiments, the architecture of the layout of the MTCMOS standard cell having a structure for low power consumption may be supplemented so that the pick-up cells are included in the power line of the MTCMOS cell. When a logic circuit is constructed using the library layout of the MTCMOS cell in which the related pick-up cells are not included, the pick-up cells, including only the ends of the pick-up cells, are not needed every 50 µm. The flexibility of the cell placement may therefore be improved.

Figure 1A:
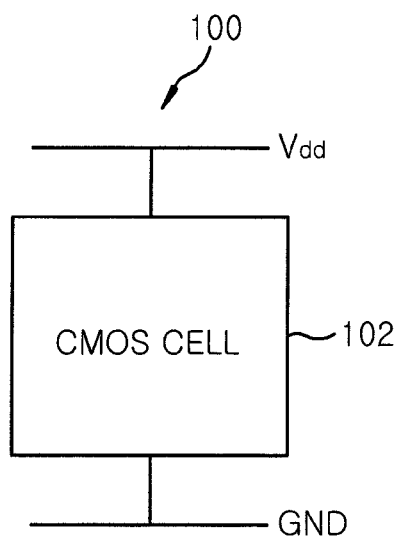
FIG. 1 illustrates the structure of a related MTCMOS cell.
Figure 1B:
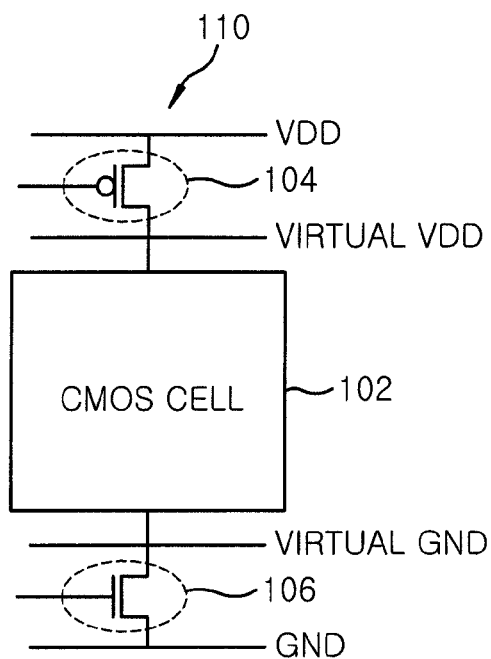
Figure 2:
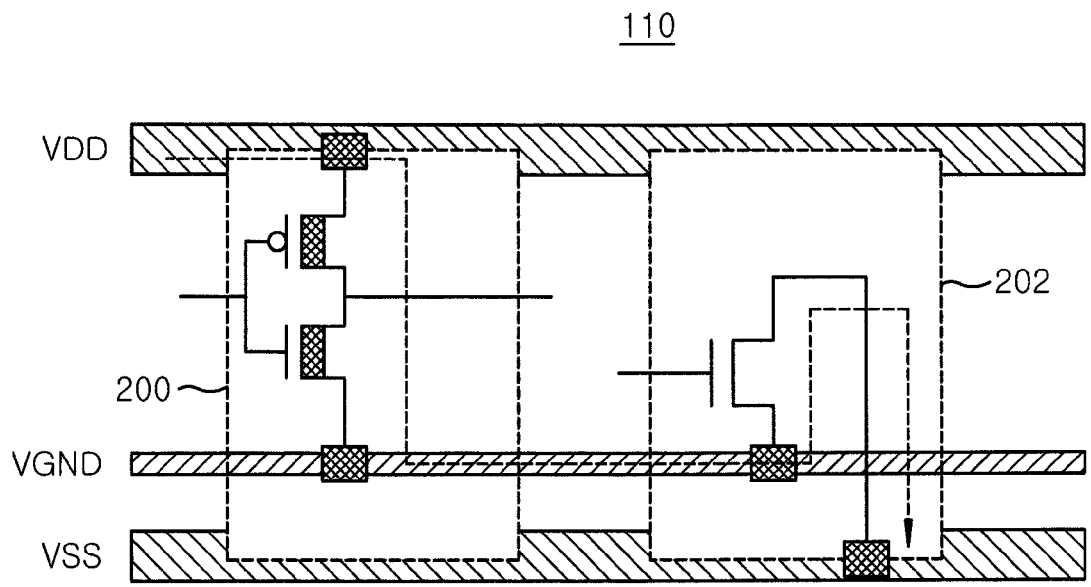
FIG. 2 illustrates the layout of the related MTCMOS cell.
Figure 3:
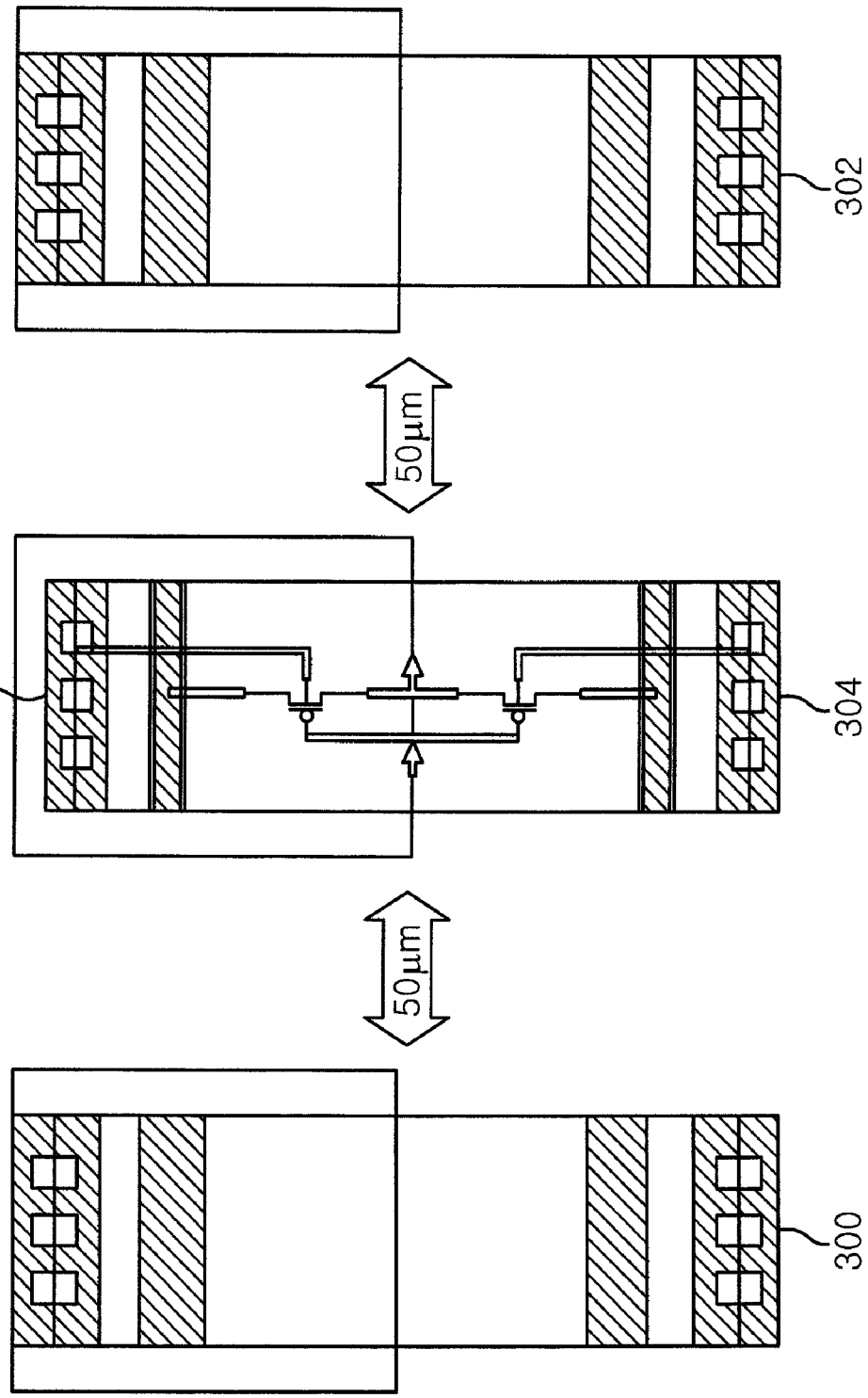
FIG. 3 illustrates the placement of the related MTCMOS cell without pick-up cells.
Figure 4:
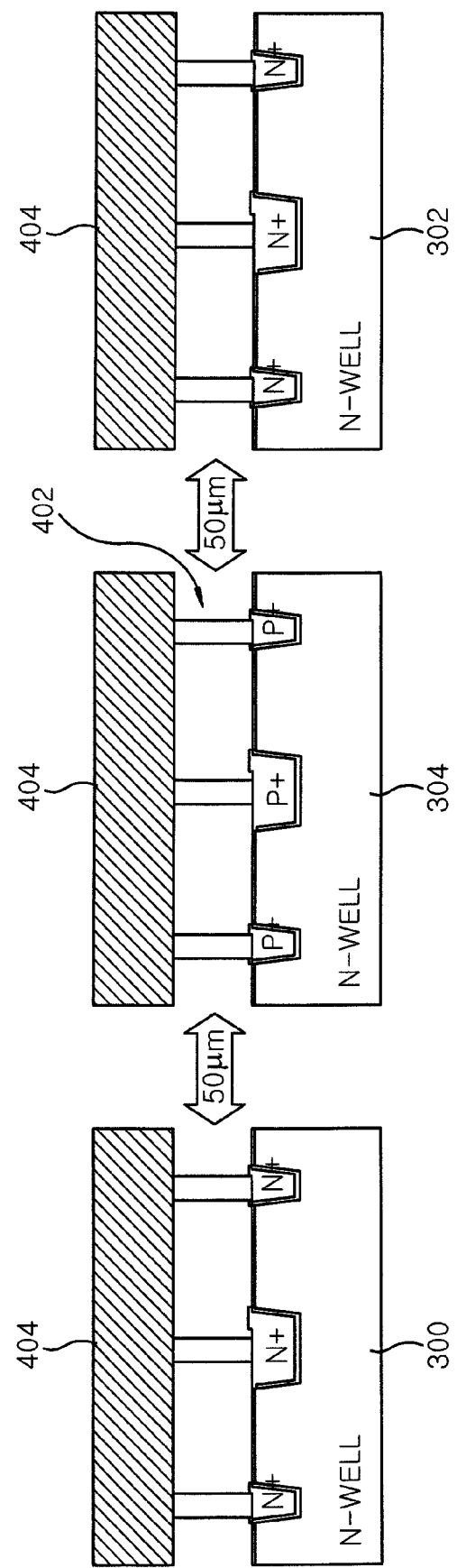
FIG. 4 is a sectional view of the related MTCMOS cell without the pick-up cells.
Figure 5:
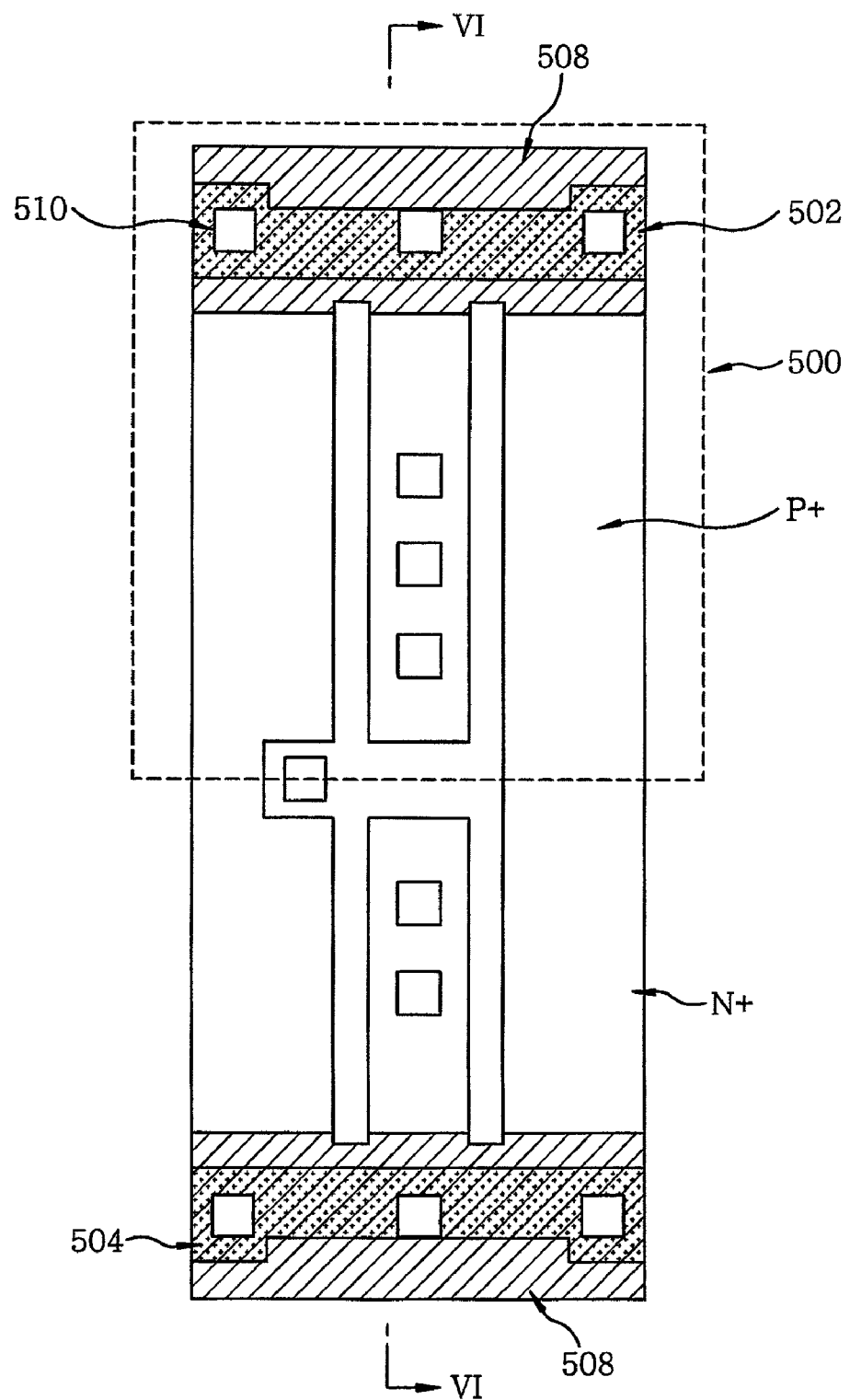
FIG. 5 illustrates the layout of a MTCMOS cell in which pick-up cells are included in a power line according to embodiments.

Example FIG. 5 illustrates the layout of a MTCMOS cell in which pick-up cells may be included in a power line according to embodiments. Hereinafter, processes of forming the MTCMOS inverter cell in which the pick-up cells may be included in the power line will be described with reference to example FIG. 5. First, an n-well 500 may be formed in a region where a p-type transistor is to be formed in an active region over a semiconductor substrate. Then, the p-type transistor may be formed by doping source/drain regions on both sides of a gate in the n-well region with p+ material. An n-type transistor may be formed by doping source/drain regions on both sides of a gate in an active region where the n-type transistor is to be formed with n+ material.

According to embodiments, the semiconductor substrate in a region adjacent to the drain of the p-type transistor may be doped with n+ material to form a n+ pick-up cell 502. The semiconductor substrate in a region adjacent to the source of the n-type transistor may be doped with the p+ material to form a p+ pick-up cell 504. In example FIG. 5, a reference numeral 510 refers to a contact.

Therefore, the power line for connecting the drain of the p-type transistor and the source of the n-type transistor to each other and the pick-up cells are connected to each other. Additional pick-up cells are not required, unlike in the structure of the related MTCMOS cell. As a result, it is possible to reduce wasted space on the semiconductor substrate.

In the structure of the related MTCMOS cell, the pick-up cells must be formed at a distance from the MTCMOS cell at uniform intervals, wasting space on the semiconductor substrate. As illustrated in the architecture of the layout of the MTCMOS cell of example FIG. 5, according to embodiments, the pick-up cells may be placed in a region adjacent to the drain and source of the p-type and n-type transistors under the power line for connecting the drain and source of the p-type and n-type transistors of the MTCMOS inverter to each other.

The pick-up cells included in the upper and lower power line of the MTCMOS cell may be bone-shaped to prevent a design rule violation against central contacts. In addition, according to embodiments, a second metal wiring line 508 may be used as the power line for connecting the drain and source ends of the p-type and n-type transistors of the MTCMOS inverter in order to secure the space of a first metal wiring line 506 when routing is performed to improve routability.

Figure 6:
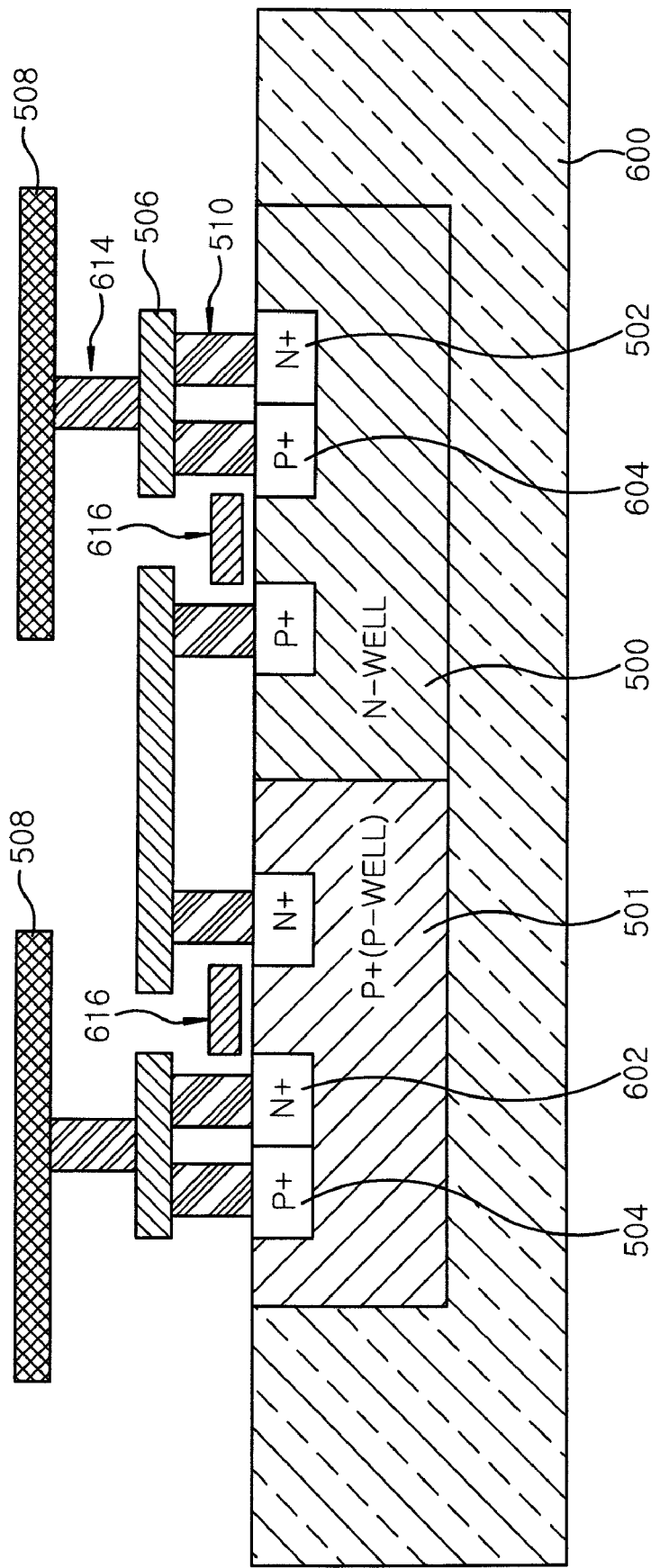
FIG. 6 is a sectional view taken along the line VI-VI of the MTCMOS cell according to embodiments.

Example FIG. 6 is a sectional view taken along the line A-A' of the MTCMOS inverter cell. In the related MTCMOS standard cell, the first metal wiring line 506 is used for power. In embodiments, vias 614 may be connected onto the first metal wiring line 506 to laminate the second metal wiring line 508 so that the second metal wiring line 508 may be used as the power line of the MTCMOS standard cell. Therefore, efficiency can be improved during the cell routing. In example FIG. 6, reference numeral 616 refers to a poly layer.

That is, in the MTCMOS cell according to embodiments, as illustrated in example FIG. 6, an n-well 500 may be formed over a semiconductor substrate 600 in a region where the p-type transistor is formed. The n-well 500 may be formed in an active region isolated by an isolation layer. A p-well 501 may be formed in the opposite region where the n-type transistor may be formed.

The p-type transistor may be formed in the n-well region 500 and the n-type transistor may be formed in the opposite p-well region 501. An n+ pick-up cell 502 and a p+ pick-up cell 504 may be formed in a region adjacent to the drain 604 of the p-type transistor and the source 602 of the n-type transistor. According to embodiments, the n+ pick-up cell 502 and the p+ pick-up cell 504 may be formed under the first and second metal wiring lines 506 and 508 used as power lines of the MTCMOS cell. Therefore, additional space for the pick-up cells is not required so that flexibility of the placement of the MTCMOS cell may be improved.

After forming the first metal wiring line 506 for connecting the drain 604 of the p-type transistor and the source 602 of the n-type transistor to each other and the n+ pick-up cell 502 and the p+ pick-up cell 504 to each other, the second metal wiring line 508 may be formed. The second metal wiring line 508, which is to be used as the power line, may be connected onto the first metal wiring line 506 through a via.

Figure 7:
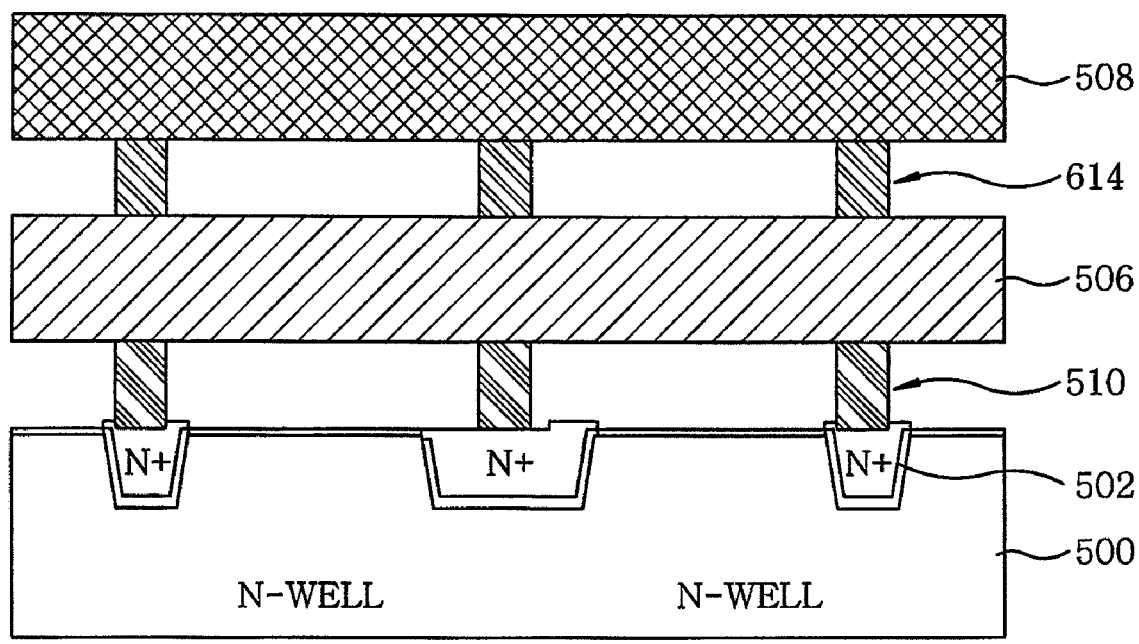
FIG. 7 is a sectional view of the power line of the MTCMOS cell including the pick-up cells according to embodiments.

Example FIG. 7 is a sectional view taken along a PMOS region power line of the MTCMOS inverter cell in a horizontal direction. In the related art, the pick-up cells are placed on both sides of the MTCMOS cell at uniform intervals. In embodiments, the n+ pick-up cells may be included on both sides of the power line of the MTCMOS cell. As illustrated in example FIG. 7, the n+ pick-up cell 502 has only the n+ in the end of a PMOS region. After connecting the n+ pick-up cell 502 to the first metal wiring line 506 in the PMOS region power line of the MTCMOS cell, the vias may be laminated over the first metal wiring line 506. The second metal wiring line 508 may be laminated over the vias 614. Such a structure can improve efficiency during the cell routing.

As described above, according to embodiments, an architecture of the layout of the MTCMOS standard cell designed for low power consumption may be supplemented with pick-up cells included in the power line of the MTCMOS cell. Therefore, when the logic circuit is constructed using the library layout of the MTCMOS cell in which the related pick-up cells are not included, pick-up cells, including only the ends of the pick-up cells, will not be needed every 50 µm. The flexibility of the cell placement may thereby be improved. Since additional space for the pick-up cells is not required, the MTCMOS may be further miniaturized, saving space on the semiconductor substrate.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   an n-well and a p-well formed in an active region over a semiconductor substrate;
   a p-type transistor formed in the n-well region and an n-type transistor formed in the p-well region;
   a first metal wiring line connecting a drain of the p-type transistor and a source of the n-type transistor to each other;
   an n+ pick-up cell connected to the first metal wiring line in a region adjacent to a drain of the p-type transistor; and
   a p+ pick-up cell connected to the first metal wiring line in a region adjacent to the source of the n-type transistor.

2. The apparatus of claim 1, comprising a second metal wiring line, to be used as a power line, connected to the first metal wiring line through vias.

3. The apparatus of claim 2, wherein the n+ and p+ pick-up cells are formed in a power line region of a multi-threshold complimentary metal oxide semiconductor cell where the first and second metal wiring lines are formed.

4. The apparatus of claim 1, wherein the n+ and p+ pick-up cells are bone-shaped.

* * * * *